United States Patent [19]

Flaim et al.

[11] Patent Number: 5,368,989
[45] Date of Patent: Nov. 29, 1994

[54] PHOTOLITHOGRAPHIC ARTICLE UTILIZING POLYMERS WITH LIGHT-ABSORBING PROPERTIES FOR ANTI-REFLECTIVE COATING

[75] Inventors: Tony D. Flaim, St. James; James E. Lamb, III, Rolla; Kimberly A. Moeckli, Salem; Terry Brewer, Rolla, all of Mo.

[73] Assignee: Brewer Science, Inc., Rolla, Mo.

[21] Appl. No.: 55,916

[22] Filed: Apr. 30, 1993

Related U.S. Application Data

[62] Division of Ser. No. 835,715, Feb. 12, 1992, Pat. No. 5,234,990.

[51] Int. Cl.$^5$ ............................................. G03F 7/11
[52] U.S. Cl. .................................. 430/271; 430/302; 430/512
[58] Field of Search ................. 430/271, 302, 512; 524/220, 221, 233, 241, 261, 284, 376, 726, 731, 755, 770, 773, 609, 612

[56] References Cited

U.S. PATENT DOCUMENTS

| | | | |
|---|---|---|---|
| 4,910,122 | 3/1990 | Arnold et al. | 430/313 |
| 4,950,583 | 8/1990 | Brewer et al. | 430/311 |
| 5,057,399 | 10/1991 | Flaim et al. | 430/313 |
| 5,110,697 | 5/1992 | Lamb, III et al. | 430/14 |

*Primary Examiner*—Charles L. Bowers, Jr.
*Assistant Examiner*—Christopher G. Young
*Attorney, Agent, or Firm*—Veo Peoples, Jr.

[57] ABSTRACT

A composition and a method for forming an anti-reflective layer for DUV microlithographic processes is disclosed. The compositions of the present invention includes a polymer dissolved in a suitable solvent. The polymers are polysulfone and polyurea polymers which possess inherent light absorbing properties at deep ultraviolet wavelengths. In accordance with the method of the present invention, these compositions are applied to a substrate to form an anti-reflective coating, and thereafter a photoresist material that is compatible with the anti-reflective coating is applied.

1 Claim, No Drawings

PHOTOLITHOGRAPHIC ARTICLE UTILIZING POLYMERS WITH LIGHT-ABSORBING PROPERTIES FOR ANTI-REFLECTIVE COATING

This is a divisional of copending application Ser. No. 07/835,715 filed on Feb. 12, 1992, U.S. Pat. No. 5,234,990.

BACKGROUND OF THE INVENTION

1. Field of the Invention

This invention relates generally to anti-reflective coatings for use in deep ultraviolet microlithography, and more particularly to forming such anti-reflective coatings from polymeric materials having intrinsic light-absorbing properties.

2. Description of the Prior Art

Integrated circuit production relies on the use of photolithographic processes to define the active elements and interconnecting structures within devices. Until recently, G-line (436 nm) photoresists have been used for the bulk of microlithographic applications. There is now a strong trend toward the use of resists which are sensitive at shorter wavelengths to improve resolution at submicron feature sizes. This has led to the development of photoresist products which are sensitive to deep ultraviolet (DUV) radiation. The majority of these new resists are designed to operate at 248 nm.

Decreasing feature size coupled with the more widespread use of monochromatic DUV exposure systems has intensified the problems associated with standing wave effects which occur when light is reflected from the substrate during exposure. The formation of standing waves reduces critical dimension control and causes large linewidth variations over device topography.

In accordance with the prior art, several techniques have been used to minimize problems associated with standing wave effects. One Such technique which is discussed in C. Nolscher et al., "High Contrast Single Layer Resist and Anti-reflective Layers—An Alternative to Multilayer Resist Techniques," SPIE volume 1086 (1989). In accordance with Nolscher, a carefully controlled thickness of titanium nitride is deposited on the substrate to act as an interference filter for reflected light. However, this technique is not effective for DUV microlithography because of the high reflectivity of most substrates at deep ultraviolet wavelengths.

Another prior art technique for eliminating reflectivity problems involves applying an organic film with a low index of refraction (typically 1.4 or less) over the photoresist to damp out higher order standing waves. This method is discussed in T. Tanaka et al., J. Electrochem. Soc., volume 137, 3900 (1990). However, the benefits of this method have not yet been proven for DUV-microlithography.

A third prior art technique involves using an anti-reflective layer (referred to hereafter as ARC, meaning anti-reflective coating) beneath the photoresist to inhibit the formation of standing waves and prevent their detrimental effects on photoresist resolution. Numerous anti-reflective layer technologies exist today for use in microlithographic processes. The most common technique is applying a light absorbing organic polymer coating on the substrate prior to applying the photoresist. This method is discussed in M. Listvan et al., "Multiple Layer Techniques in Optical Lithography: Applications to Fine Line MOS Production," SPIE volume 470, p. 85 (1984); U.S. Pat. No. 4,910,122 entitled "Anti-Reflective Coating" issued to T. Brewer; and A. Jeffries et al., "Two Anit-Reflective Coatings for Use Over Highly Reflective Topography," SPIE Proceedings, Volume 539, p. 342 (1985). This method provides nearly complete attenuation of reflected light and prevents formation of all standing waves including the primary, or first-order, standing wave. The location of the light absorbing layer between the substrate and resist means that all substrates coated with the material will exhibit roughly the same reflectivity, eliminating the need for exposure dose adjustments when the substrate type changes. This prior art technique offers the greatest control over standing wave effects and at the same time provides the widest photoresist processing latitude and broadest substrate compatibility.

Traditionally, ARCs have been formulated by adding dyes which absorb at the exposure wavelength to a polymer coating. While a series of prior art dye-loaded commercial products have been prepared, dye-loaded ARCs are susceptible to numerous problems. One such problem involves separation of the polymer and dye components when the ARC is spin coated. This phenomenon is evidenced by the appearance of film defects such as graininess, blotches, spots, dewetted areas, etc., and in some cases complete coating failure.

Problems also result from variations in the dye content of the ARC which depend on spinning conditions. For example, we have observed that dye compounds can be removed selectively from the wet ARC as excess coating material spins off of the substrate. This problem is especially prevalent with crystalline dyes.

A third problem with dye-loaded ARCs involves dissolution or swelling of the anti-reflective coating accompanied by selective removal of the dye components. This problem is commonly referred to as dye stripping. The dye stripped from the ARC remains in the photoresist and causes nonuniformities in the resist exposure profile. This is especially true with DUV photoresists which operate via acid catalysis and are easily poisoned by organic contaminants. At the same time, dye loss by stripping reduces the ability of the ARC to control reflections. Dye stripping depends on the properties of the dye and polymer components as well as their relative proportions and chemical interactions.

Still another problem with dye-loaded ARCs is interfacial layer formation. This refers to a situation where the components of the resist and the ARC become mixed in a narrow zone between the two layers. Interfacial layer formation invariably leads to "resist footing" which refers to the presence of a small protrusion at the bottom of the resist feature after development. This defect complicates linewidth determination and reduces critical dimension control.

There is also a problem with thermal diffusion of the dye component into the photoresist when the latter is baked. Dye diffusion can occur over distances as large as 50%–60% of the photoresist thickness. In such cases, photoresist contrast and sidewall profiles will be seriously degraded.

These problems are particularly prevalent with prior art dye loaded ARCs designed for DUV microlithography. DUV photoresists contain more aggressive solvents than conventional G-line resist systems. Such solvents enhance dye stripping and interfacial layer formation. In some cases, complete removal of an ARC has been observed when a DUV resist is applied. Furthermore, in formulating dye loaded DUV ARCs the majority of dyes suitable for this spectral region are either 1) very soluble in photoresist solvents or 2) highly crystalline, meaning in either case that the dye concentration in the ARC must be kept relatively low. As a result, the ARC thickness must be increased to ≧2000 Å to obtain sufficient light absorptivity with the film.

The necessity for ARC thickness of ≧2000 Å seriously inhibits the development of ARCs for submicron DUV microlithographic processing. For submicron work, anisotropic dry etching (plasma etching or reactive ion etching) must be used to transfer the resist pattern into the ARC. In turn, the ARC must be ultrathin (≦1300 Å) to limit the amount of resist erosion that will occur when the ARC is dry etched and to maintain an acceptable etch bias. However, the limits on dye concentration which are imposed by various chemical factors make the ultra-thin thickness goal unattainable. For this reason, the development of dye-loaded ARCs for DUV microlithography has been severely curtailed.

Dye-loading is not amenable to the development of ARCs for deep ultraviolet microlithography. For some of the same reasons, the polymeric materials used in prior art ARCs are unsuitable for use in DUV antireflective coating products. The table below provides several relevant examples.

| Material | Limitations for Use in DUV ARCs | References |
| --- | --- | --- |
| polymethyl methacrylate | excessive interlayer mixing with resist | U. S. Pat. No. 4,370,405 to O'Toole; and A. Yen et al., "Fabrication of 100 nm-Period Gratings Using Achromatic Holographic Lithograph," Microelectronic Engineering, Vol. 11, p. 201 (1990). |
| polyimides - | | U. S. Pat. No. 4,910,122 to T. Brewer; M. W. Legenza et al., "A New Class of Bilevel and Mono-level Positive Resist Systems Based on a Chemically Stable Imide Polymer," SPIE Proceedings, Volume 539, p. 250 (1985); and C. H. Ting and K. L. Liauw, "An improved Deep Ultraviolet (DUV) Multilayer Resist Process for High Resolution Lithography," SPIE Proceedings, Volume 469, p. 24 (1984). |
| soluble polyimides | poor solvent resistance and/or poor coating quality and may be soluble in photoresist developers | |
| curable polyimides | unstable solution viscosity leading to poor film thickness reproducibility, must be refrigerated | |
| polyvinylpyridine | low DUV lot absorption, poor solvent resistance | |
| triazine resins | soluble in photoresist developers | W. Ishii, et al, "Anti-Reflective Coating Material for Highly Reflective Surfaces with Topography", SPIE volume 631, p. 295 (1986). |
| poly(alkene sulfones) | poor solvent resistance and low thermal stability | U. S. Pat. No. 4,910,122 to T. Brewer. |

Another group of polymeric materials which have been used for microlithographic applications are the aromatic polysulfones. For example, U.S. Pat. No. 4,835,086 describes the use of Udel ® (Amoco Performance Products, Inc.) polysulfone as a barrier layer between two radiation sensitive layers. Another polysulfone, Victrex ® (ICI Americas), has been preferred for most microlithographic applications, e.g., lift-off processes, because of its higher solvent resistance in comparison to Udel ®. The structure for Victrex ® polysulfone is:

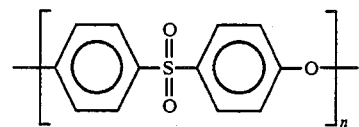

Victrex ® must be spin coated from N-methylpyrrolidone, a strong polar solvent since it is insoluble in less polar, but more volatile solvents such as ketones or esters. European Patent Application number 8710976.0 (publication number 0 257 255) describes the use of Victrex ® films containing dyes to retard the detrimental effects of reflected light during photoresist exposure. However, such films do not have the appropriate solubility properties for ARC applications. This can be explained as follows.

There are two main types of DUV photoresists in use today, positive-working and negative-working. Both operate via acid catalysis. The positive-working type has extremely high contrast and is easily poisoned by small amounts of bases, especially organic amines. While N-methylpyrrolidone is only very weakly basic, it usually contains strongly basic contaminants such as methyl amine at low levels. The volatility of these contaminants and their detrimental effect on resist performance precludes the use of NMP-containing materials such as a Victrex ® coating and a positive DUV resist in the same work area.

Negative-working DUV photoresists become insolubilized upon exposure to 248 nm radiation, forming a negative-tone image. Like most negative-working systems, they are more sensitive than positive-tone systems and, consequently, are not susceptible to poisoning by trace levels of basic compounds. However, negative-working DUV resists require more polar solvent systems than their positive-tone counterparts. Diglyme (2-methoxyethyl ether) and anisole, two chemically inert but very polar solvents, are common constituents in the resist formulations; Shipley's SNR-248 ® negative-tone DUV photoresist is a good example. The presence of these aggressive solvents in the resist means that the ARC must have exceptional solvent resistance to avoid interlayer mixing. Victrex ® coatings do not have this degree of solvent resistance. Consequently, they cannot be used in ARC applications involving modern negative-working DUV photoresists.

SUMMARY OF THE INVENTION

It is therefore an object of the present invention to provide a composition capable of forming an anti-reflective layer which reduces problems associated with standing wave effects which may occur during deep ultraviolet microlithography.

It is a further object of the present invention to provide a composition capable of forming an anti-reflective coating having increased light absorption power per unit film thickness, allowing the design of ultra-thin ARCs which can provide sufficient light absoptivity with a film thickness $\leq 1300$ Å.

It is a further object of the present invention to provide a polymeric material which is intrinsically light-absorbing, and which need not be loaded with a dye in order to form an anti-reflective layer, thereby eliminating problems associated with dye stripping and dye migration during photoresist spin coating and baking.

It is a further object of the present invention to provide a composition capable of forming an anti-reflective coating having improved adhesion to micro-electronic substrates, improved coating quality, and decreased interfacial layer formation.

These and other objects are met by the present invention through combining the polymeric component and the light absorbing (or chromophoric) components of an ARC into a single chemical entity, and thereby providing a polymeric anti-reflection coating with good solvent resistance and high intrinsic DUV light absorptivity for use in DUV photoresists processes. In accordance with the present invention, polymers which contain aromatic polysulfone units, aromatic polyurea units, or combinations thereof with other common polymer connecting structures have been found to exhibit intrinsic light-absorbing properties. This class of polymeric materials can be formulated into anti-reflective coatings suitable for submicron microlithography without the need for added dye components.

DETAILED DESCRIPTION

In accordance with the present invention, ARCs which are fully compatible with negative-working and/or positive-working DUV photoresists can be prepared from certain polymers which contain the functional units:

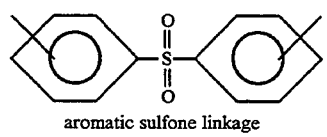

aromatic sulfone linkage

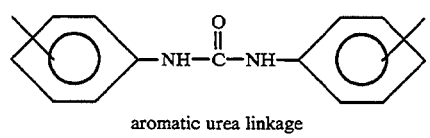

aromatic urea linkage or polymers prepared from combinations thereof with other common polymer connecting structures.

In particular, in accordance with the present invention, the aromatic polysulfone structures (formula I) which can be used to form compositions useful as anti-reflective coatings for deep ultraviolet microlithography include those structures having the formula:

(III)

(IV)

where R may be selected from the following groups or combinations thereof:

(A)

wherein $R_1=R_4$; $R_2=R_3$; $R_1$, $R_2$, $R_3$, $R_4$, and $R_5$ are selected from the group consisting of hydrogen and methyl; and $R_6$ is selected from the group consisting of hydrogen, methyl and phenyl;

(B)

wherein $R_1=R_2=R_3=R_4$ and are selected from the group consisting of hydrogen and methyl;

(C)

(D)

wherein $R_1=R_2=R_3=R_4$ and are selected from the group consisting of hydrogen and methyl;

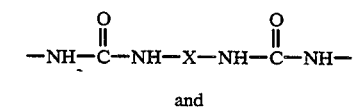

and

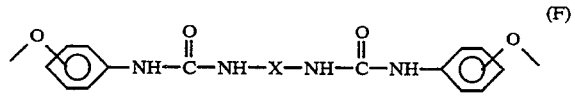

wherein X (formulas F and G) is selected from the group consisting of:

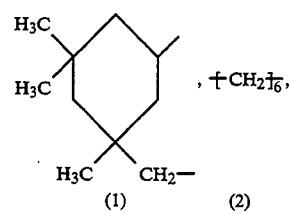

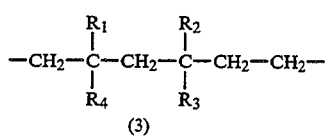

wherein $R_1=R_2=R_3=CH_3$ and $R_4=H$, or $R_1=R_2=R_4=CH_3$ and $R_3=H$. In a preferred embodiment of the present invention, $n>10$, and the polysulfone has an average molecular weight of $10^3$ to $10^6$.

For compatibility with positive-working DUV resists, aromatic polysulfones should be soluble in cyclohexanone at room temperature. However, coated films should be unaffected by solvents such as EGMEA, PGMEA, ethyl lactate, and butyl acetate.

A good example of a polymer which meets these criteria is Amoco Udel ® polysulfone, a copolymer of 4,4'-isopropylidenediphenol (Bisphenol A) and 4-chlorophenylsulfone. The structure of Udel ® is shown below:

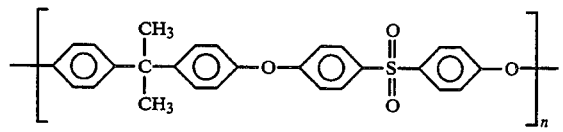

UDEL ® POLYSULFONE

Although, Udel ® is principally used as a molding plastic and is not used for coating applications, Udel ® may be dissolved in cyclohexanone and used as a spin coatable ARC for positive-working DUV photoresists. Its high absorptivity across the 220–260 nm band allows excellent reflection control to be obtained at ARC film thicknesses as small as 500 Å. It can be used on all microelectronic substrates. The ability to coat the ARC from cyclohexanone, a fast-drying solvent, makes an ARC bake step unnecessary, meaning the resist can be applied immediately after the ARC. This processing feature increases device throughput dramatically and saves considerable processing cost.

The usefulness of Udel ® as a DUV ARC material for positive resists stems from its unique solubility properties when compared to other commercial polysulfones which normally require strong polar solvents like NMP for spin coating. It is likely that any polysulfone which contains Bisphenol A as a principal monomeric constituent would have similar solubility properties as Udel ® and could be used in the same fashion.

Polysulfones can also be used for microlithographic processes involving negative-working DUV resists provided their chemical structure imparts resistance to diglyme, anisole, or mixtures of these with PGMEA or other ester solvents. We have discovered that the introduction of urea linkages into the polysulfone is a preferred way of achieving the desired solvent resistance properties. An example of such a polymeric material, termed a polyurea sulfone, is shown below:

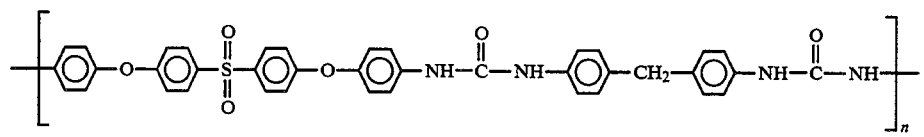

POLYUREA SULFONE

This material is NMP-soluble but shows no intermixing with diglyme or anisole containing photoresists. An especially attractive feature of the polymer is that both the aromatic sulfone and aromatic urea linkages contribute to the strong DUV absorptivity of the coating.

The strong DUV absorptivity of the aromatic urea connecting unit as well as the solvent resistance it contributes to polymers means that a wide variety of polyureas can be designed for DUV ARC applications in systems where NMP can be tolerated. In accordance with the present invention, the aromatic polyurea structures (formula II) which can be used to form compositions useful as anti-reflective coatings for deep ultraviolet microlithography include those structures having the formula:

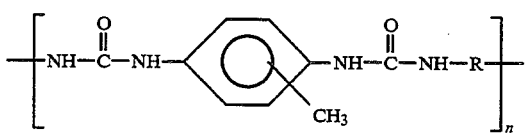

TYPE 1 POLYUREA

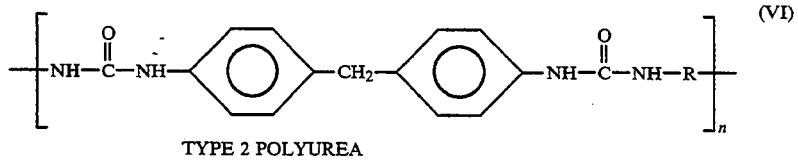

TYPE 2 POLYUREA where R may be selected from the following groups or combinations thereof:

 (H)

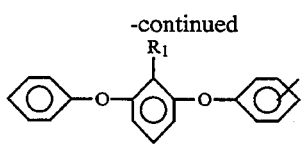 (O)

wherein $R_1$ is selectedから H and C≡N;

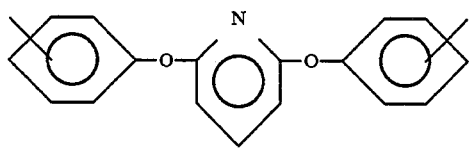 (P)

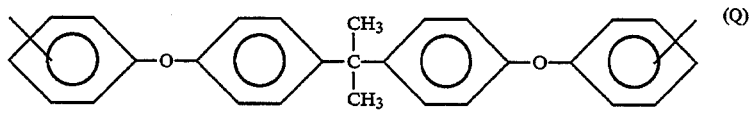 (Q)

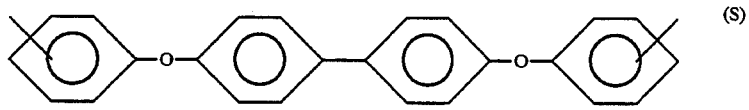 (S)

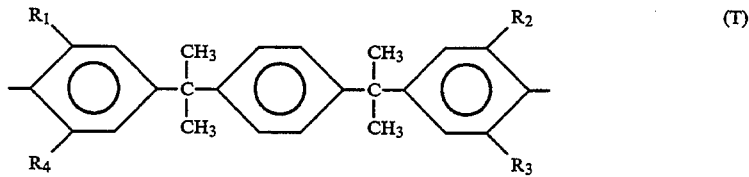 (T)

wherein $R_1=R_2=R_3=R_4=H$ or $CH_3$;

wherein $R_1$ is selected from the group consisting of Cl, C≡N, $CH_3$, H, $OCH_3$, and $COOR_2$, wherein $R_2$ is —$CH_3$ or —$CH_2CH_3$;

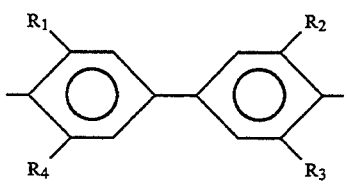 (U)

wherein $R_1=R_2$ and are selected from consisting of H, $CH_3$, $OCH_3$, and $R_3=R_4$ and are selected from consisting of H and $CH_3$;

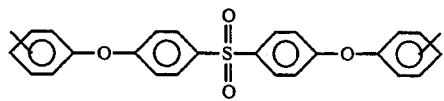 (J)

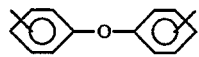 (K)

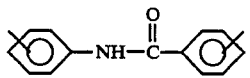 (L)

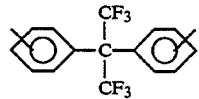 (M)

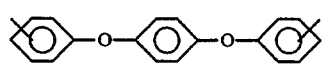 (N)

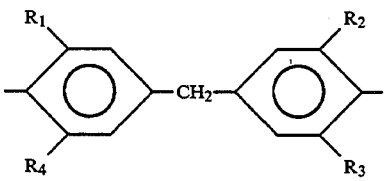 (V)

wherein $R_1=R_2=R_3=R_4=H$ or $CH_3$. In a preferred embodiment of the present invention, n>10, and the polyurea has an average molecular weight of $10^3$ to $10^6$.

The polymers set forth above are particularly effective in forming ARCs with intrinsic light absorbing properties for use in microlithography, because coatings formed with these polymers meet a variety of physical and chemical criteria, including:

1. The coatings formed with such polymers are opaque at and exhibit strong light absorption across the target band of DUV wavelengths, i.e. the polymers exhibit sufficient absorption to alleviate problems associated with reflected light such as problems associated with standing waves. The band is usually centered in the vicinity of 248 nm, and typically ranges from approximately 190 nm to approximately 260 nm. To maintain acceptable ARC thicknesses, the absorbance (A) per 100 nm film thickness should be >0.75.

2. The coatings are not attacked by photoresist compounds. More specifically, depending on the photoresist in question, the coatings formed with the polysulfones and polyureas set forth above do not dissolve or swell in solvents such as ethylene glycol monomethyl ether acetate (EGMEA), propylene glycol monomethyl ether acetate (PGMEA), diglyme (2-methoxyethyl ether), anisole, ethyl lactate, xylene, or butyl acetate.

3. Interfacial layer formation is avoided by using such coatings, because such coatings do not mix with the photoresist during resist spincoating or during the soft bake of the resist.

4. Such coatings are thermally stable to at least 250° C. in that they do not crosslink or become insoluble when exposed to temperatures in this range. Furthermore, such coatings do not become intractable when exposed to plasmas or reactive ion etching processes.

5. Such coatings are fully removable by dry etching and/or dissolution in suitable solvents after the resist and substrate have been processed appropriately.

6. Such coatings exhibit good adhesion to all microelectronic substrates. Important substrates are crystalline silicon (doped and undoped), chemical vapor deposited silicon dioxide, thermally-grown silicon dioxide, polycrystalline silicon (doped and undoped which may include diffusion-doped and ion implanted types), spin-on glasses, refractory glasses (doped and undoped), titanium nitride, silicon nitride, aluminum oxide, sapphire, beryllium oxide, gallium arsenide, other polymers such as polyimides, and metals such as aluminum, aluminum-copper alloys, aluminum-silicon-copper alloys, tungsten, copper, gold, chromium, nickel, and other common metals and their alloys.

7. Such coatings provide homogeneous, defect-free films of uniform thickness when applied on wafer sizes up to 200 mm and larger. Good coating quality is maintained over device topography.

8. Such coatings do not re-emit absorbed light (fluoresce) at wavelengths to which the photoresist is sensitive.

9. Such coatings are not soluble in photoresist developers, particularly aqueous bases such as tetramethylammonium hydroxide solutions.

10. Such coatings provide extremely reproducible film thickness and DUV absorptivity. This requires that the polymeric component be stable with regard to polymer molecular weight, chemical structure, and viscosity characteristics.

The polysulfone and polyurea polymers included in the compositions of the present invention can be synthesized by any standard polymerization technique. Such techniques are well known in the prior art.

The polymer compositions of the present invention are prepared and used to form anti-reflective coatings in the following manner. Initially one must select ARC and resist materials which are compatible. ARC polymers which do not require N-methylpyrrolidone for coating are preferred for use with positive-working DUV photoresists. All acid-catalyzed DUV photoresists are compatible with the polymeric ARCs disclosed herein, provided they do not contain solvents which attack the ARC.

The polymers of the present invention are first dissolved in a suitable solvent. Solvents and cosolvents for ARCs which are compatible with both acid-catalyzed, positive-working DUV photoresists and acid-catalyzed, negative-working DUV photoresists include cyclohexanone, cyclopentanone, 2-methoxyethyl ether (diglyme), anisole, ethyl lactate, acetophenone, ethylene glycol monomethyl ether, ethylene glycol monomethyl ether acetate (EGMEA), propylene glycol monomethyl ether, propylene glycol monomethyl ether acetate (PGMEA), gamma butrylolactone, tetrahydrofurfuryl alcohol, and mixtures thereof. Additional solvents and cosolvents which are also compatible with negative-working DUV photoresists, include N-methylpyrrolidone, N,N-dimethylacetamide, 1,1,3,3-tetramethylurea, 1,2-dimethyl-2-imidazolidinone, mixtures thereof, as well as mixtures with the other solvents listed above. The preferred solvent for use with positive-working photoresists is a mixture of cyclohexanone and diglyme containing less than 20 volume % diglyme. The preferred solvent for use with negative-working photoresists is a mixture of N-methylpyrrolidone and cyclohexanone wherein the volume ratios are within the range 20/80–60/40.

Various additives may be added to the polymer solution. A dye may be added to improve broadband light absorption. When added, such dyes should constitute 0.5%–50 wt. % of the total ARC solids. Examples of such dyes include 4,4'-bis(N,N-dimethylamino)benzophenone (Michler's Ketone) and 7-diethylamino-4-methylcoumarian (coumarin 1), either alone or in combination with one another, for 365 nm (1-line), and curcumin for 436 nm (G-line). Adhesion promoters may also be added to the polymer composition. An adhesion promoter may constitute 0.5–4.0 wt. % of the total ARC solids. Examples of appropriate adhesion promoters include 3-aminopropyltriethoxysilane and (3-glycidoxypropyl)trimethoxysilane. Nonionic surfactants may also be added to the polymer composition in an amount of 0.5–10.0 wt. % of the total ARC solids. Examples of such nonionic surfactants include FC-171 fluorosurfactant and FC-430 fluorinated coating additive, both available from 3M Corporation.

The polymer is then spincoated onto a substrate at 1000–6000 RPM for 15–90 seconds to form a coating with a thickness of 500–10,000 Å. Static or dynamic dispense may be used. Preferably the polymer is spincoated at 3000–5000 RPM for 60 seconds using dynamic dispense. The preferred coating thickness is 500–1500 Å, however the thicker coatings within the 500–10,000 Å range may be preferred for planarization applications in surface-imaging resist schemes. The preferred method for determining the appropriate ARC thickness involves measuring the reflectivity of the resist when it is applied over an ARC-coated substrate. The ARC thickness is increased until reflectivity is reduced to $\leq 20\%$. In most cases, this requires an ARC thickness of 500–1300 Å.

For ARCs which are compatible with positive-working DUV photoresists, the photoresist may be immediately applied over the ARC or the ARC can be baked prior to the application of the photoresist. The no-bake method is appropriate for feature sizes ≧0.30 μm. This procedure reduces resist cycle time, and increases wafer throughput. If a bake is performed, it can be done at a temperature up to 250° C. under a hotplate or under oven conditions. In addition, the process may include multiple bakes at sequentially higher temperatures.

For ARCs which are compatible with negative-working DUV photoresists, a bake must be performed prior to application of the photoresist. The bake should be done at 150° C.–250° C. under a hot plate or under oven conditions. This process may also include multiple bakes at sequentially higher temperatures.

In accordance with the process of the present invention, conventional techniques are employed for application and baking of the photoresist. In addition, photoresist processing uses known techniques. After the resist has been imaged, the pattern is preferably transferred into the ARC by plasma etching in oxygen or other effective gas mixtures. Examples of the latter include $Cl_2$, $Cl_2/O_2$, and $SF_6$.

Although the anti-reflective coatings of the present invention are described herein in the context of a device having a substrate-ARC-photoresist layer configuration, the ARC's of the present invention may be used along with additional layers. The formation and use of such additional layers are well known in the art. Examples of such additional layers include layers which function as adhesion promoter(s), planarization layer(s), absorbing layer(s), interfacial mixing barrier(s), release layer(s), or contrast enhancement layer(s). Preferably such additional layers would be placed between the substrate and the ARC.

The manner of making and using the compositions of the present invention is illustrated in the following examples. These examples, however, are not intended to limit the scope of the present invention.

EXAMPLE 1

A copolymer of 4,4'-isopropylidenediphenol and 4-chlorophenylsulfone [Amoco Udel® polysulfone, 2.1 wt. %] was dissolved in a mixture of cyclohexanone and diglyme containing approximately 0.2 wt. % organosilane coupling agent as adhesion promoter. It was spincoated onto a 8" silicon nitride-coated substrate at 3000 RPM for 20 seconds to form nominal 600 Å thick deep ultraviolet (DUV) anti-reflective coating (ARC). The coating was uniform and defect-free.

A 1.1 μm thickness of positive-working, acid-catalyzed DUV photoresist soluble in PGMEA was immediately applied over the ARC by spincoating at 3000 RPM for 20 seconds. The resist was soft baked for 60 seconds at 90° C. and then exposed on a stepper operating at 248 nm with an excimer laser source. The exposure dose was 17 Mj/cm². The resist was post-exposure baked at 100° C. for 60 seconds to change the solubility of the exposed areas in the resist. The resist was developed in 0.21N metal ion-free developer at 21° C. for 45 seconds to form the resist pattern. Scanning electron microscopy showed that the resist profiles were nearly vertical (85°–87°). Linewidths were very uniform even over topography.

The resist pattern was transferred into the silicon nitride layer and then into an underlying polysilicon layer by reactive ion etching. Linewidth analysis by scanning electron microscopy showed that the critical dimension (CD) variation across the substrate was 0.03 μm.

EXAMPLE 2

To demonstrate the effectiveness of the ARC for reducing linewidth variation, Example 1 was repeated without applying the polysulfone anti-reflective layer prior to resist coat. Critical dimension variation increased to 0.17 μm.

EXAMPLE 3

Example 1 was repeated but with an added 90° C. 60 second hot plate bake-step between ARC apply and resist spincoat. As in Example 1, after the resist development the resist profiles were nearly vertical and the linewidths were uniform, and after transfer of the pattern to the substrate the CD variation was 0.03 μm.

EXAMPLE 4

Amoco Udel® polysulfone (3.4 wt. %) was dissolved in a mixture of cyclohexanone and diglyme containing approximately 0.2 wt. % organosilane coupling agent as adhesion promoter. It was spincoated onto an 8" silicon nitride-coated substrate at 3000 RPM for 20 seconds to form nominal 900 Å thick DUV anti-reflective coating which was then hot plate baked at 90° C. for 60 seconds and 200° C. for 30 seconds. The coating was uniform and defect-free.

A 1 μm thickness of positive-working, acid-catalyzed DUV photoresist was applied over the ARC by spincoating at 3000 RPM for 20 seconds. The resist was soft baked for 60 seconds at 90° C. and then exposed on a stepper operating at 248 nm with an excimer laser source. The exposure dose was 19 Mj/cm². The resist was post-exposure baked at 100° C. for 60 seconds to change the solubility of the exposed areas in the resist. The resist was developed in 0.21N metal ion-free developer at 21° C. for 45 seconds to form the resist pattern. Scanning electron microscopy showed that the resist profiles were nearly vertical (88°–90°) and uniform across the substrate.

The resist pattern was transferred into the silicon nitride layer and then into an underlying polysilicon layer by reactive ion etching. Linewidth analysis by scanning electron microscopy showed that the critical dimension (CD) variation across the substrate was 0.01 μm.

EXAMPLE 5

Poly(urea sulfone) was prepared by reacting bis[4-(4-aminophenoxy)phenyl]-sulfone with methylenedi-p-phenyl diisocyanate in N-methyl pyrrolidone (NMP). The resulting polymer varnish was diluted with NMP and cyclohexanone to form a nominal 4.5 wt. % solution which when spincoated at 5000 RPM for 60 Seconds provided a 1300 Å thick anti-reflective coating with an absorbance value of 1.2 at 248 nm, or 0.92 per 100 nm.

The poly(urea sulfone) ARC was spincoated onto 6-inch, phosphorus-implanted polysilicon substrates and hot plate baked at 205° C. for 60 seconds to dry the film. These substrates were then coated with various thicknesses of Shipley Megaposit® SNR-248 deep ultraviolet photoresist and soft baked. A swing curve (a plot of resist reflectance vs. resist thickness) was generated using the substrates and compared to a swing curve obtained from specimens which were not coated with ARC prior to resist application. The results showed that for substrates which did not receive ARC treatment, the reflectance varied 35% (from a high of 38% to a low of 3%) over a 350 Å resist thickness range. With ARC, however, reflectance was reduced to 11±3% over the same thickness-range.

EXAMPLE 6

A solution of poly(urea sulfone) in NMP/cyclohexanone (as in Example 5) was spincoated onto planar polysilicon, silicon nitride, silicon dioxide, aluminum, and tungsten substrates at 5000 rpm for 60 seconds and hot plate baked at 205° C. for 60 seconds to obtain a 140 nm thick anti-reflective coating. A 600 nm film thickness of Shipley Megaposit ® SNR-248 DUV resist was then applied over the ARC. The wafer specimens were exposed using a GC ALS Laserstep ® operating at 248 nm with an 0.35 numerical aperture to define dense 0.50 μm lines in the resist. Following a post-exposure bake, the wafers were spray developed with 0.14 N Shipley MF-312 developer. The optimum exposure dose, the exposure latitude, and CD control for each substrate type with and without ARC application, were determined by comparing linewidth values as a function of dose.

| Substrate | Exposure Dose (Mj/cm²) | | Exposure Latitude (%) | | CD Control [3σ], μm] | |
|---|---|---|---|---|---|---|
| | No ARC | With ARC | No ARC | With Arc | No ARC | With ARC |
| polysilicon | 14 | 22 | 29 | 33 | 0.06 | 0.02 |
| silicon dioxide | 19 | 22 | 21 | 29 | 0.04 | 0.04 |
| silicon nitride | 20 | 22 | 35 | 33 | 0.03 | 0.02 |
| tungsten (CVD) | 19 | 24 | 10 | 33 | 0.06 | 0.03 |

With ARC application all substrates required approximately the same exposure dose and demonstrated similar broad exposure latitudes.

EXAMPLE 7

A solution of poly(urea sulfone) in NMP/cyclohexanone (as in Example 6) was spincoated onto polysilicon, silicon nitride, silicon dioxide, aluminum, and silicon substrates at 5000 rpm for 60 seconds and hot plate baked at 205° C. for 60 seconds to obtain a 140 nm thick anti-reflective coating. The reflectance of each coated substrate was then compared to that of the uncoated substrate; the results are summarized below. In all cases, substrate reflectance was reduced dramatically with ARC application.

| | Reflectance at 248.5 nm (%) (referenced to bare silicon wafer) | | |
|---|---|---|---|
| Substrate | No ARC | With ARC | Reduction (Δ) |
| silicon | 100 | 14 | 86 |
| polysilicon | 61 | 14 | 47 |
| silicon dioxide | 78 | 9 | 69 |
| silicon nitride | 88 | 13 | 75 |
| aluminum | 113 | 15 | 98 |

EXAMPLE 8

Poly(urea sulfone) ARC in NMP/cyclohexanone (as in Example 6) was spincoated at 5000 rpm for 60 seconds onto a POCl₃-doped polysilicon substrate patterned with 250 nm vertical polysilicon steps. The substrate was then hot plate baked at 205° C. for 60 seconds to dry the 140 nm thick ARC. A 600 nm film thickness of Shipley Megaposit ® SNR-248 DUV resist was applied over the ARC. The wafer specimens were then exposed using a GC ALS Laserstep ® operating at 248 run with a 0.35 numerical aperture to define dense 0.50 μ lines in the resist which were orthogonal to the polysilicon topography. Following a post-exposure bake, the wafers were spray developed with 0.14 N Shipley MF-312 developer. Linewidth uniformity was determined at various points over the structures as a measure of the effectiveness of the ARC for reducing linewidth variation. The data was compared to an untreated (no ARC) control specimen.

| | Linewidth Variation (μm) | |
|---|---|---|
| Feature Region | No ARC | With ARC |
| planar | 0.48 | 0.46 |
| step neck | 0.60 | 0.44 |
| step surface | 0.72 | 0.48 |
| med-step valley | 0.48 | 0.44 |
| CD Range | 0.24 | 0.04 |

We claim:
1. A photolithographable article of manufacture comprising:
   a) a top layer of photoresist material;
   b) an anti-reflective sublayer consisting essentially of a polymer; and
   c) a micro-electronic substrate; said polymer having a functional repeat unit selected from the group consisting of:

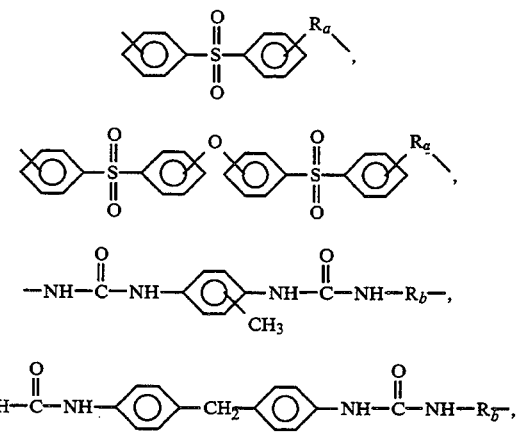

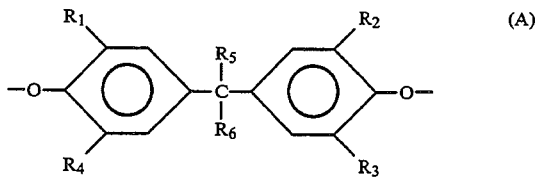

and combinations thereof, wherein $R_a$ is selected from the group consisting of:

$R_1$, $R_2$, $R_5$, $R_6$, $R_4$, $R_3$ (A)

—O—⟨⟩—C—⟨⟩—O— wherein $R_1$=$R_4$; $R_2$=$R_3$; $R_1$, $R_2$, $R_3$, $R_4$, and $R_5$ are selected from the group consisting of hydrogen and methyl; and $R_6$ is selected from the group consisting of hydrogen, methyl and phenyl;

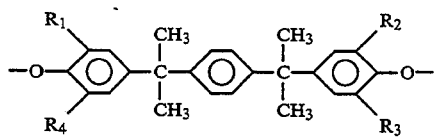 (B)

wherein $R_1=R_2=R_3=R_4$ and are selected from the group consisting of hydrogen and methyl;

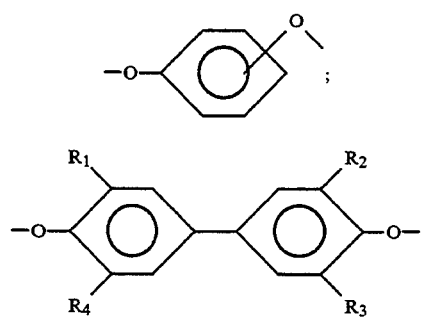 (C)

(D)

wherein $R_1=R_2=R_3=R_4$ and are selected from the group consisting of hydrogen and methyl;

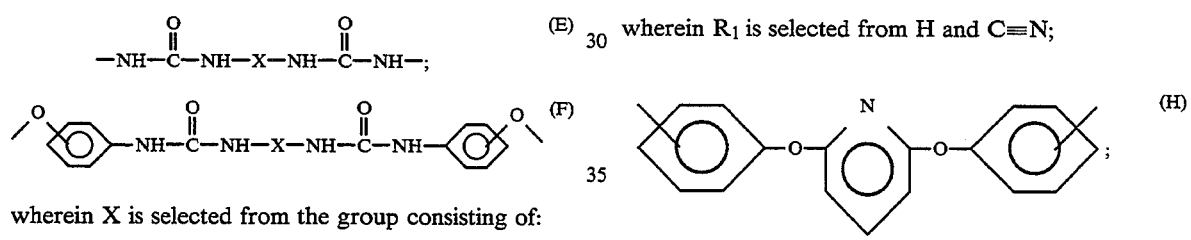
(E)
(F)

wherein X is selected from the group consisting of:

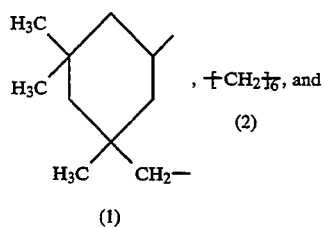, $-(CH_2)_6-$, and
(1)  (2)

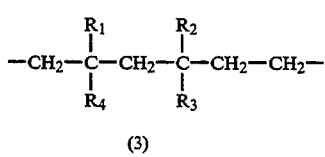
(3)

wherein $R_1=R_2=R_3=CH_3$ and $R_4=H$, or $R_1=R_2=R_4=CH_3$ and $R_3=H$; and G) combinations thereof; wherein $R_b$ is selected from the group consisting of:

 (A)

wherein $R_1$ is selected from the group consisting of Cl, $C\equiv N$, $CH_3$, H, $OCH_3$, and $COOR_2$, wherein $R_2$ is $-CH_3$ or $-CH_2CH_3$;

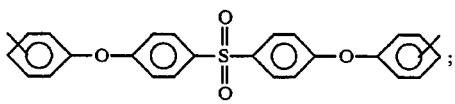 (B)

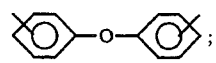 (C)

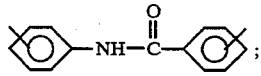 (D)

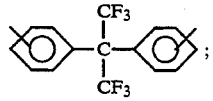 (E)

 (F)

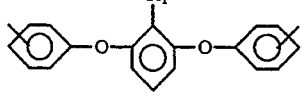 (G)

wherein $R_1$ is selected from H and $C\equiv N$;

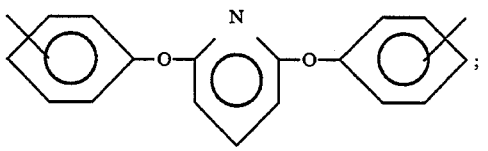 (H)

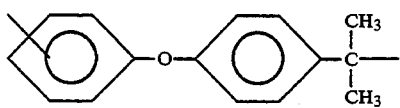 (I)

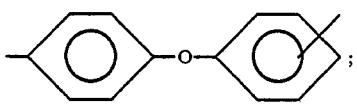

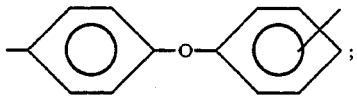 (J)

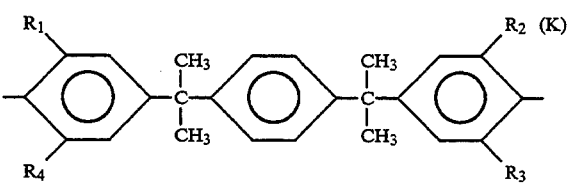 (K)

wherein $R_1=R_2=R_3=R_4=H$ or $CH_3$;

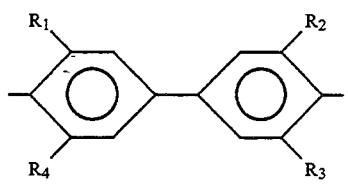 (L)
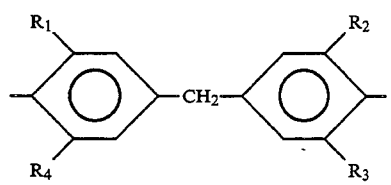 (M)
wherein $R_1=R_2$ and are selected from consisting of H, $CH_3$, $OCH_3$, and $R_3=R_4$ and are selected from consisting of H and $CH_3$;
wherein $R_1=R_2=R_3=R_4=$H or $CH_3$; and (N) combinations thereof.
* * * * *